United States Patent
Rosales et al.

(10) Patent No.: US 11,616,185 B2
(45) Date of Patent: Mar. 28, 2023

(54) ENERGY HARVESTING DEVICE FOR ELECTRONIC DEVICES

(71) Applicant: QUALCOMM Incorporated, San Diego, CA (US)

(72) Inventors: Jorge Luis Rosales, San Diego, CA (US); Victor Adrian Chiriac, San Diego, CA (US); Mario Francisco Velez, San Diego, CA (US); Peng Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 412 days.

(21) Appl. No.: 15/611,524

(22) Filed: Jun. 1, 2017

(65) Prior Publication Data
US 2018/0351066 A1  Dec. 6, 2018

(51) Int. Cl.
*H01L 35/32* (2006.01)
*H01L 35/02* (2006.01)
*H01L 35/30* (2006.01)
*H01L 35/34* (2006.01)

(52) U.S. Cl.
CPC .............. *H01L 35/32* (2013.01); *H01L 35/02* (2013.01); *H01L 35/30* (2013.01); *H01L 35/34* (2013.01)

(58) Field of Classification Search
CPC ................................ H01L 35/32; H01L 35/30
See application file for complete search history.

(56) References Cited

U.S. PATENT DOCUMENTS

| 5,983,644 | A | * | 11/1999 | Bolandi | ............ H01L 21/67103 |
| | | | | | 62/3.2 |
| 6,000,225 | A | * | 12/1999 | Ghoshal | .................. F25B 21/02 |
| | | | | | 62/3.7 |
| 6,043,982 | A | * | 3/2000 | Meissner | ................ H01L 23/38 |
| | | | | | 257/930 |
| 6,094,919 | A | * | 8/2000 | Bhatia | ..................... H01L 23/38 |
| | | | | | 165/104.21 |

(Continued)

FOREIGN PATENT DOCUMENTS

| JP | 2007042895 A | 2/2007 |
| TW | 200606994 A | 2/2006 |

(Continued)

OTHER PUBLICATIONS

Francioso, et al., Journal of Power Sources, 2011, vol. 196, pp. 3239-3243 (Year: 2011).*

(Continued)

*Primary Examiner* — Sadie White
(74) *Attorney, Agent, or Firm* — Loza & Loza, LLP

(57) ABSTRACT

A device that includes a region comprising a heat generating device, and an energy harvesting device coupled to the region comprising the heat generating device. The energy harvesting device includes a first thermal conductive layer, a thermoelectric generator (TEG) coupled to the first thermal conductive layer, and a second thermal conductive layer coupled the thermoelectric generator (TEG) such that the thermoelectric generator (TEG) is between the first thermal conductive layer and the second thermal conductive layer. In some implementations, the energy harvesting device includes an insulation layer.

9 Claims, 10 Drawing Sheets

PROFILE VIEW

(56) References Cited

U.S. PATENT DOCUMENTS

| | | | |
|---|---|---|---|
| 6,424,533 B1* | 7/2002 | Chu | H01L 23/38 257/930 |
| 7,928,548 B2 | 4/2011 | Bernstein et al. | |
| 9,366,822 B1* | 6/2016 | Lentine | G02F 1/011 |
| 2002/0069906 A1* | 6/2002 | Macris | H01L 35/34 136/203 |
| 2002/0191937 A1* | 12/2002 | Knox | G02B 6/4453 385/135 |
| 2004/0065880 A1* | 4/2004 | Hunt | G01R 31/311 257/48 |
| 2006/0075761 A1* | 4/2006 | Kitchens | B67D 1/0862 62/3.3 |
| 2006/0086118 A1* | 4/2006 | Venkatasubramanian | F25B 21/02 62/259.2 |
| 2007/0056620 A1* | 3/2007 | Bahr | H01L 23/38 136/201 |
| 2008/0178920 A1* | 7/2008 | Ullo | E21B 47/017 136/204 |
| 2009/0205696 A1* | 8/2009 | Koester | H01L 35/30 136/201 |
| 2010/0207573 A1* | 8/2010 | Mo | H01L 33/645 320/101 |
| 2011/0256653 A1* | 10/2011 | Garcia Ramos | H01L 23/38 438/55 |
| 2012/0291425 A1 | 11/2012 | Mitchell et al. | |
| 2013/0087180 A1* | 4/2013 | Stark | H01L 35/30 136/205 |
| 2013/0139524 A1* | 6/2013 | Kim | F25B 21/02 62/3.7 |
| 2013/0248712 A1* | 9/2013 | Abdolvand | G01J 5/16 438/55 |
| 2014/0014154 A1* | 1/2014 | Hayashi | H01L 35/32 136/205 |
| 2014/0176041 A1 | 6/2014 | Sun | |
| 2015/0068576 A1* | 3/2015 | Kryskowski | H01L 35/02 136/212 |
| 2016/0133811 A1* | 5/2016 | Chen | F21V 29/54 438/122 |
| 2016/0149109 A1 | 5/2016 | Nies et al. | |
| 2016/0163945 A1* | 6/2016 | Ahdoot | H01L 35/30 136/201 |
| 2016/0284965 A1* | 9/2016 | Makosinski | H01L 35/32 |
| 2016/0351774 A1 | 12/2016 | Schneider et al. | |

FOREIGN PATENT DOCUMENTS

| | | |
|---|---|---|
| TW | 200929629 A | 7/2009 |
| TW | 200937690 A | 9/2009 |
| WO | WO-2015085473 A1 | 6/2015 |

OTHER PUBLICATIONS

Buchner, et al., Journal of Microelectromechanical Systems, 2008, vol. 17, pp. 1114-1119 (Year: 2008).*

Hirota, et al. "Thermoelectric infrared imager and automotive applications," Proc. SPIE 4369, Infrared Technology and Applications XXVII, (Oct. 10, 2001) (Year: 2001).*

Wang, International Communications in Heat and Mass Transfer, 48 (2013) 80-85 (Year: 2013).*

International Search Report and Written Opinion—PCT/US2018/032596—ISA/EPO—dated Sep. 3, 2018.

Taiwan Search Report—TW107116251—TIPO—dated Jul. 23, 2021.

Taiwan Search Report—TW107116251—TIPO—dated Mar. 3, 2022.

* cited by examiner

PROFILE VIEW

PROFILE VIEW

PLAN VIEW

ENERGY HARVESTING DEVICE FOR ELECTRONIC DEVICES

BACKGROUND

Field

Various features relate an energy harvesting device, and more specifically to an energy harvesting device for an electronic device.

Background

FIGS. 1 and 2 illustrate a mobile device 100 that includes a display 102, a cover 104 and a camera device 200. Electronic devices include external and internal components that generate heat. Some of these internal components include a central processing unit (CPU), a graphics processing unit (CPU) and/or memory. Some of these internal components can generate a lot of heat. Specifically, a high performance CPU and/or CPU of an electronic device can generate a lot of heat, especially when performing data intensive operations (e.g., games, processing video). Similarly, the camera device 200 can also generate a substantially amount of heat.

FIG. 3 illustrates a profile view of the mobile device 100 that includes heat generating components. As shown in FIG. 3, the mobile device 100 includes the display 102, the cover 104, the camera device 200, a printed circuit board (PCB) 303 and a die 306. The die 306 and the camera device 200 generate heat that is wasted away.

There is an ongoing need for improved electronic device performance, including devices that last longer, while at the same time keeping the form factor of the device as small as possible.

SUMMARY

Various features relate an energy harvesting device, and more specifically to an energy harvesting device for an electronic device.

One example provides a device that includes a region comprising a heat generating device, and an energy harvesting device coupled to the region comprising the heat generating device. The energy harvesting device includes a first thermal conductive layer, a thermoelectric generator (TEG) coupled to the first thermal conductive layer, and a second thermal conductive layer coupled the thermoelectric generator (TEG) such that the thermoelectric generator (TEG) is between the first thermal conductive layer and the second thermal conductive layer.

Another example provides a device that includes a region comprising a heat generating device, and a means for energy harvesting coupled to the region comprising the heat generating device. The means for energy harvesting includes a first thermal conductive layer, a means for thermal energy harvesting coupled to the first thermal conductive layer, and a second thermal conductive layer coupled the means for thermal energy harvesting such that the means for thermal energy harvesting is between the first thermal conductive layer and the second thermal conductive layer.

Another example provides a method for fabricating a device. The method provides a heat generating device to a region of the device. The method couples an energy harvesting device to the region comprising the heat generating device, wherein coupling the energy harvesting device comprises: providing a first thermal conductive layer; coupling a thermoelectric generator (TEG) to the first thermal conductive layer; and coupling a second thermal conductive layer to the thermoelectric generator (TEG) such that the thermoelectric generator (TEG) is located between the first thermal conductive layer and the second thermal conductive layer.

Another example provides a method for harvesting energy in a device. The method uses a first thermal conductive layer to dissipate heat away from a heat generating device and towards a thermoelectric generator (TEG). The method uses the thermoelectric generator (TEG) to convert the heat that passes though the thermoelectric generator (TEG) into an electrical energy. The method uses a second thermal conductive layer to dissipate heat away from the thermoelectric generator (TEG) and away from the heat generating device.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may or may not be shown in block diagrams in order to avoid obscuring the aspects in unnecessary detail. In other instances, well-known circuits, structures and techniques may not be shown in detail in order not to obscure the aspects of the disclosure.

Overview

Some implementations provide a device (e.g., mobile device) that includes a region comprising a heat generating device, and an energy harvesting device coupled to the region comprising the heat generating device. The energy harvesting device includes a first thermal conductive layer, a thermoelectric generator (TEG) coupled to the first thermal conductive layer, and a second thermal conductive layer coupled the thermoelectric generator (TEG) such that the thermoelectric generator (TEG) is between the first thermal conductive layer and the second thermal conductive layer. In some implementations, the energy harvesting device includes an insulation layer. In some implementations, the first thermal conductive layer is configured to dissipate heat away from the heat generating device and towards the TEG. In some implementations, the second thermal conductive layer is configured to dissipate heat away from the TEG and away from the heat generating device.

Exemplary Energy Harvesting Device

Figure 2:
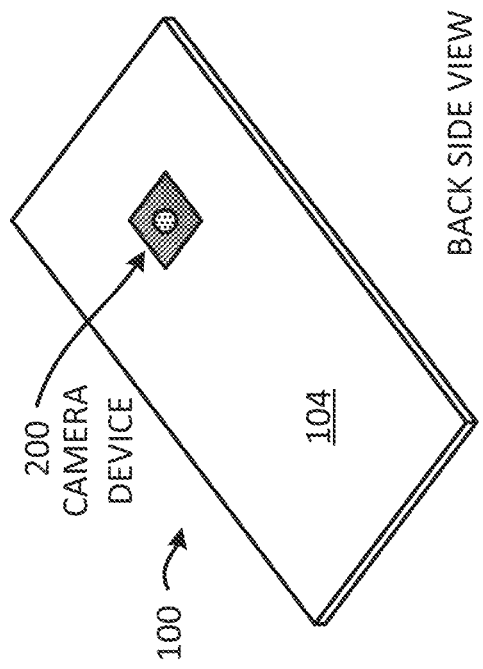
FIG. 2 illustrates a back view of a mobile device that includes a camera device.
Figure 1:
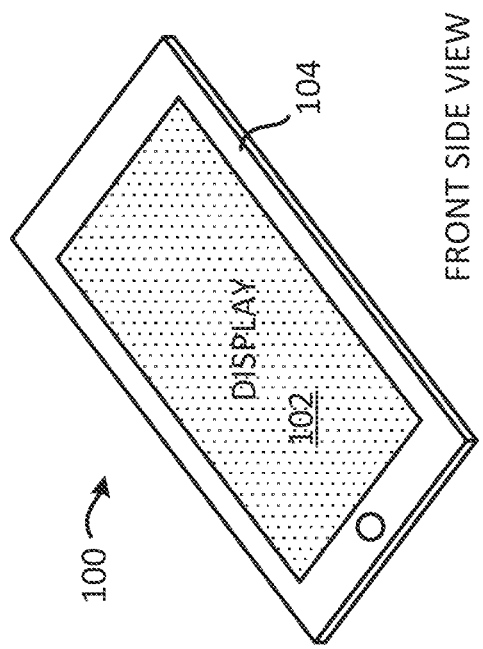
FIG. 1 illustrates a front view of a mobile device.
Figure 3:
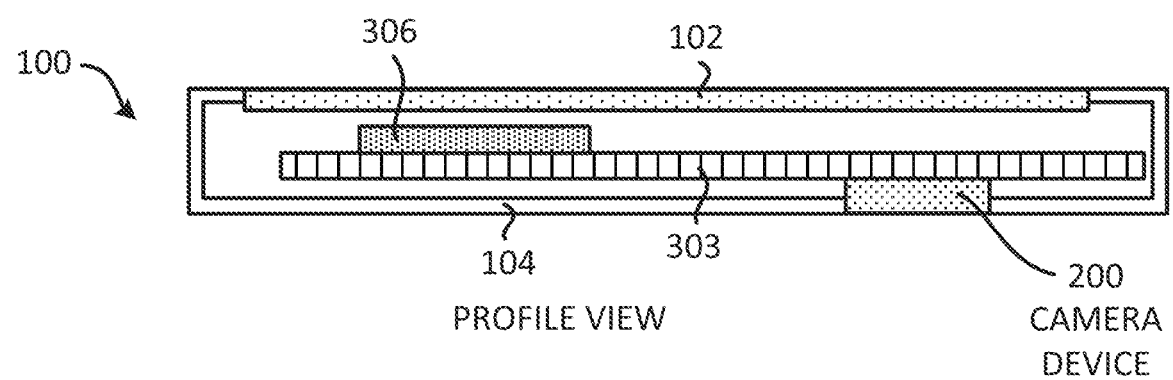
FIG. 3 illustrates a profile view of a mobile device.
Figure 4:
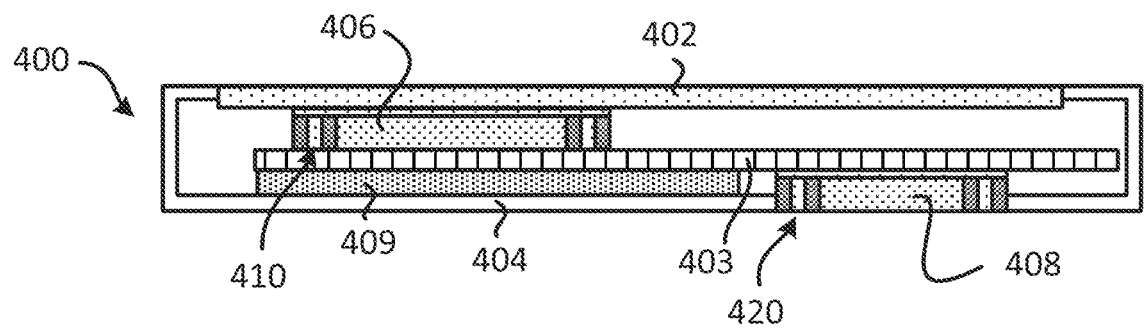
FIG. 4 illustrates a profile view of a mobile device that includes one or more energy harvesting devices.

FIG. 4 illustrates a profile view of a device 400 (e.g., electronic device, mobile device) that includes one or more energy harvesting devices. The device 400 includes a display 402, a printed circuit board (PCB) 403, a cover 404, a die 406 (e.g, semiconductor die), a camera device 408, a battery 409, a first energy harvesting device 410 and a second energy harvesting device 420.

The die 406 and the camera device 408 are examples of components and/or devices that generate heat. The first energy harvesting device 410 is coupled to the die 406. In some implementations, the first energy harvesting device 410 is coupled to a region of the device 400 that includes the die 406. The first energy harvesting device 410 is configured to harvest energy from heat that is generated by the die 406 (e.g., configured to harvest thermal energy from the die 406). The first energy harvesting device 410 is coupled to the die 406 such that the first energy harvesting device 410 at least laterally surrounds the die 406. In some implementations, the first energy harvesting device 410 may also cover a back side portion of the die 406.

The second energy harvesting device 420 is coupled to the camera device 408. In some implementations, the second energy harvesting device 420 is coupled to a region of the device 400 that includes the camera device 408. The second energy harvesting device 420 is configured to harvest energy from heat that is generated by the camera device 408 (e.g., configured to harvest thermal energy from the camera device 408). The second energy harvesting device 420 is coupled to the camera device 408 such that the second energy harvesting device 420 at least laterally surrounds the camera device 408. In some implementations, the second energy harvesting device 420 may also cover a back side portion of the camera device 408. The second energy harvesting device 420 is coupled to the camera device 408 such that a lens of the camera device 408 is not covered by the second energy harvesting device 420.

FIG. 4 illustrates the energy harvesting devices (e.g., 410, 420) coupled to a surface of the PCB 403. However, different implementations may couple the energy harvesting devices differently. For example, one or more energy harvesting devices may be directly or indirectly coupled to the PCB 403. In some implementations, one or more energy harvesting devices may be partially embedded in the PCB 403. In some implementations, one or more energy harvesting devices may travel through the PCB 403. In some implementations, one or more energy harvesting devices may be directly or indirectly coupled to other regions and/or other components of the device 400.

In some implementations, the energy (e.g., thermal energy) that is harvested by the first energy harvesting device 410 and/or the second energy harvesting device 420 may be stored in the battery 409 of the device 400, or other energy storage device(s)/component(s).

Figure 5:
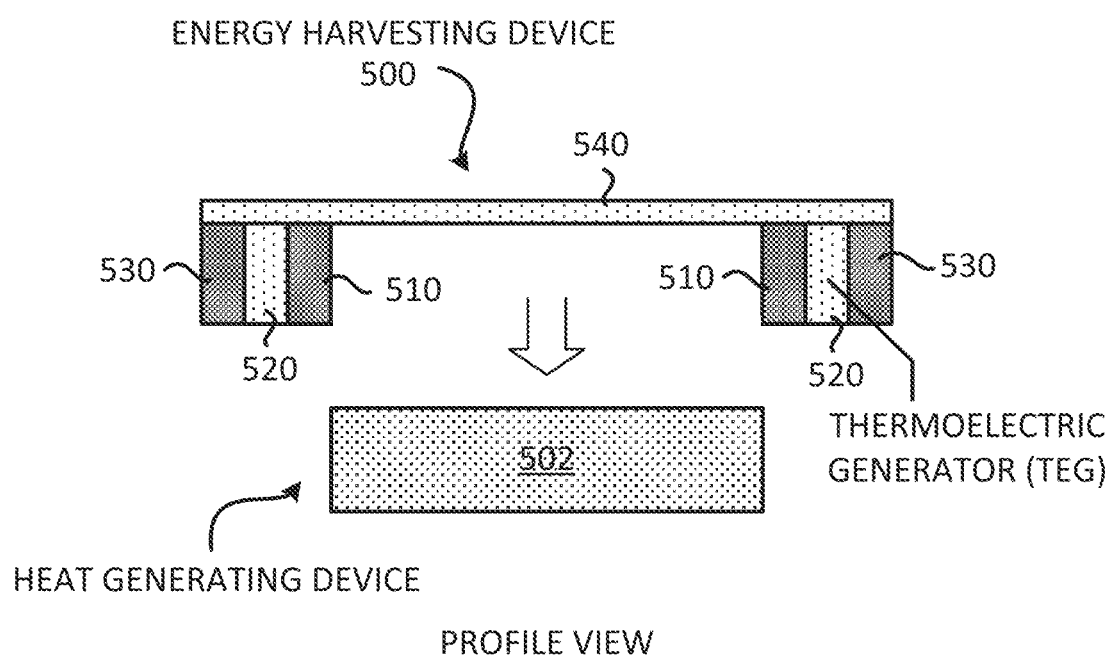
FIG. 5 illustrates an energy harvesting device coupled to a heat generating device.

FIG. 5 illustrates a profile view of an energy harvesting device 500 being coupled to a region comprising a heat generating device 502. In some implementations, the energy harvesting device 500 may be the first energy harvesting device 410 and/or the second energy harvesting device 420 of FIG. 4. In some implementations, the heat generating device 502 may include the die 406 and/or the camera device 408. The heat generating device 502 may include a die, an integrated circuit (IC) device, a central processing unit (CPU), a graphical processing unit (GPU) and/or a memory. A camera device is also an example of a heat generating device.

As shown in FIG. 5, the energy harvesting device 500 includes a first thermal conductive layer 510, a thermoelectric generator (TEG) 520, a second thermal conductive layer 530, and an insulation layer 540. A means for energy harvesting may be the energy harvesting device 500. A means for thermal energy harvesting may include the thermoelectric generator (TEG) 520. The insulation layer 540 may be optional in some implementations. A means for insulation may include the insulation layer 540. The insulation layer 540 may include a thermal interface material (TIM) in some implementations. The insulation layer 540 may provide thermal shielding in some implementations. The insulation layer 540 may help prevent heat from dissipating towards other internal components of the device 400.

The thermoelectric generator (TEG) 520 is positioned in the energy harvesting device 500 such that the thermoelectric generator (TEG) 520 is located between the first thermal conductive layer 510 and the second thermal conductive layer 530. The first thermal conductive layer 510 may be an inner ring (e.g., first ring) and the second thermal conductive layer 530 may be an outer ring (e.g., second ring) of the energy harvesting device 500. The first thermal conductive layer 510 and the second thermal conductive layer 530 have a high coefficient of thermal conductivity. The thermoelectric generator (TEG) 520 has a lower coefficient of thermal conductivity than that of the first thermal conductive layer 510 and/or the second thermal conductive layer 530. In some implementations, this configuration of materials with different thermal conductivity helps achieve a high temperature gradient across the thermoelectric generator (TEG) 520, which helps harvest energy (e.g., helps harvest thermal energy). How energy is harvested by the thermoelectric generator (TEG) 520 is further described below in at least FIG. 9. Different implementations may use materials with different coefficients of thermal conductivity. For example, in some implementations, the first thermal conductive layer 510 may include a first coefficient of thermal conductivity of about 400 W/(m·K), or greater. In some implementations, the second thermal conductive layer 530 may include a second coefficient of thermal conductivity of about 400 W/(m·K), or greater. In some implementations, the insulation layer 540 may include a coefficient of thermal conductivity of about 0.5 W/(m·K), or less. In some implementations, the insulation layer 540 may include a coefficient of thermal conductivity of about 0.3-0.5 W/(m·K). However, different implementations may use different materials for conductive layer(s) and/or the insulation layer with different coefficients of thermal conductivity.

The energy harvesting device 500 is coupled to the heat generating device 502 such that the energy harvesting device 500 at least laterally surrounds the heat generating device 502. In some implementations, the first thermal conductive layer 510 may be in contact with the heat generating device

502. In some implementations, the energy harvesting device 500 may be coupled to the heat generating device 502 through an adhesive (e.g., thermally conductive adhesive). For example, an adhesive (e.g., thermal interface material (TIM)) may be used to couple the first thermal conductive layer 510 to the heat generating device 502.

As mentioned above, the energy harvesting device 500 may include the insulation layer 540. The insulation layer 540 helps thermally shield other components of the device from heat coming from the heat generating device. Moreover, in some implementations, the insulation layer 540 helps prevent heat from dissipating vertically from the heat generating device 502. This in essence, forces or directs more heat to dissipate laterally through the first thermal conductive layer 510, the thermoelectric generator (TEG) 520 and/or the second thermal conductive layer 530, which helps the energy harvesting device 500 harvest more energy. The use of the insulation layer 540 is very counterintuitive, since it helps prevent heat from dissipating vertically. However, as described further below, the insulation layer 540 helps build up the temperature of the heat generating device 502, and helps force or direct more heat to dissipate laterally, which in turns helps the energy harvesting device harvest more energy. In some implementations, the energy harvesting device 500 is configured such that about 70 percent or more of the heat from a heat generating device 502 is dissipated laterally through the first thermal conductive layer 510, the thermoelectric generator (TEG) 520 and/or the second thermal conductive layer 530. However, different implementations may be configured to dissipate heat in the lateral direction differently. In some implementations, the insulation layer 540 may cover some portion or all of a backside of the energy harvesting device 500.

The first thermal conductive layer 510 is configured to help draw or extract heat away from the heat generating device 502, and towards the thermoelectric generator (TEG) 520. The second thermal conductive layer 530 is configured to help draw or extract heat away from the thermoelectric generator (TEG) 520, and away from the heat generating device 502. In some implementations, the combination of the two thermal conductive layers (e.g., 510, 530) helps improve or increase heat that passes through the thermoelectric generator (TEG) 520. The more heat that passes through the thermoelectric generator (TEG) 520, the more energy that can be harvested. Moreover, the higher the temperature gradient across the thermoelectric generator (TEG) 520, the more energy that can be harvested. As mentioned above, how a TEG harvests energy is further described in at least FIG. 9.

In some implementations, without both thermal conductive layers (e.g., 510, 530), less heat dissipates through the thermoelectric generator (TEG) 520, resulting in very little energy that is harvested.

As mentioned above, the first thermal conductive layer 510 helps draw heat away from the heat generating device 502. Without the first thermal conductive layer 510, the thermoelectric generator (TEG) 520 would act more as an insulation layer, and less heat would pass through the thermoelectric generator (TEG) 520.

The second thermal conductive layer 530 helps draw heat away from the thermoelectric generator (TEG) 520 and helps draw heat away from the heat generating device 502. For example, without the second thermal conductive layer 530, heat that is drawn by the first thermal conductive layer 510 would not efficiently pass through the thermoelectric generator (TEG) 520. The second thermal conductive layer 530 helps achieve a high temperature gradient across the thermoelectric generator (TEG) 520, which as described below, helps increase the amount of energy that is harvested. In some implementations, the configuration of the energy harvesting device 500 may provide a temperature gradient across the thermoelectric generator (TEG) 520 of about 25 degrees or greater (e.g., about 25-30 degrees). Thus, in some implementations, the energy harvesting device 500 may be configured to be capable of producing a temperature gradient across the thermoelectric generator (TEG) 520 of about 25 degrees or greater (e.g., about 25-30 degrees).

As an example, an energy harvesting device (e.g., 500) coupled to a heat generating device (e.g., 502) taking in about 6.0 Watts of input power may harvest energy in a range of about 90-250 mWatts. Thus, in some implementations, the energy harvesting device may be able to harvest or recoup about at least 1.5% (e.g., 1.5%-4.2%) of the input power of the heat generating device. In some implementations, the energy harvesting device may be able to harvest or recoup about at least 4.2% of the input power of the heat generating device. However, it is noted that different implementations may harvest different amounts of energy. For example, the amount of energy harvested may vary with the size and/or shape of the energy harvesting device. In some implementations, the amount of energy harvested may vary with the temperature of the heat generating device and/or the junction temperature or interface temperature of the heat generating device and the energy harvesting device.

Figure 6:
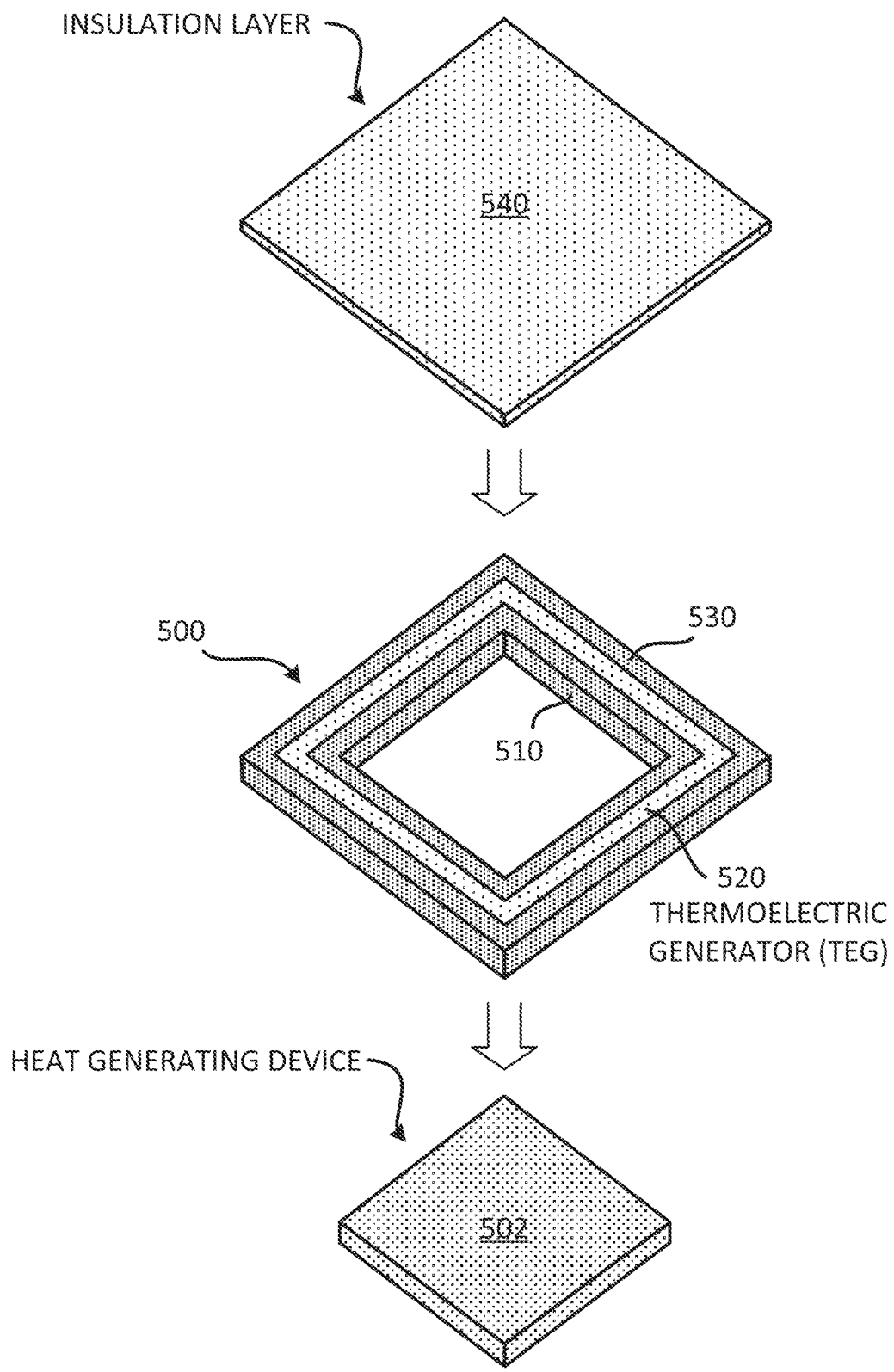
FIG. 6 illustrates an assembly view of an energy harvesting device coupled to a heat generating device.

FIG. 6 illustrates an assembly view of the energy harvesting device 500 and the heat generating device 502. As shown in FIG. 6, an insulation layer 540 (which is optional) is coupled the first thermal conductive layer 510, the thermoelectric generator (TEG) 520 and the second thermal conductive layer 530, The insulation layer 540, the first thermal conductive layer 510, the thermoelectric generator (TEG) 520 and the second thermal conductive layer 530 are coupled to a region comprising the heat generating device 502. As mentioned above, the energy harvesting device 500 may be directly or indirectly coupled to the heat generating device 502. It is noted the energy harvesting device (e.g., 500) may have different shapes and/or sizes. In some implementations, the energy harvesting device (e.g., 500) may have a shape that contours (e.g., laterally contours) a shape of a heat generating device. It is noted that in some implementations, one or more adhesives may be used to couple the insulation layer 540, the first thermal conductive layer 510, the thermoelectric generator (TEG) 520, the second thermal conductive layer 530, and/or the heat generating device 502

Exemplary Heat Flow in Energy Harvesting Device

Figure 7:
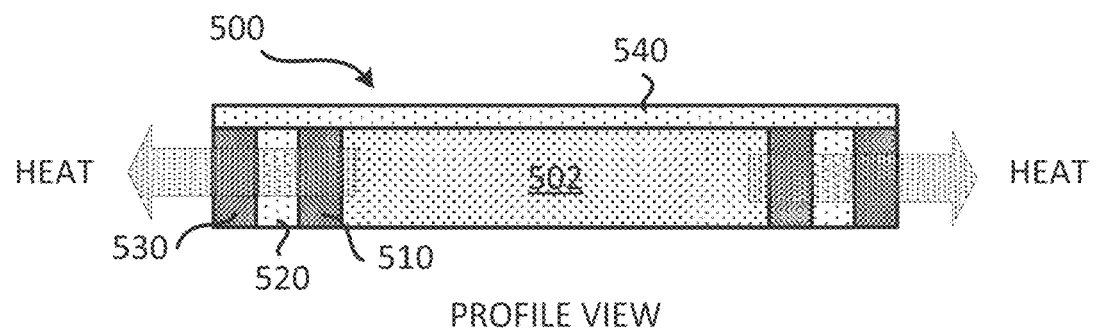
FIG. 7 illustrates a profile view of heat flow for an energy harvesting device.
Figure 8:
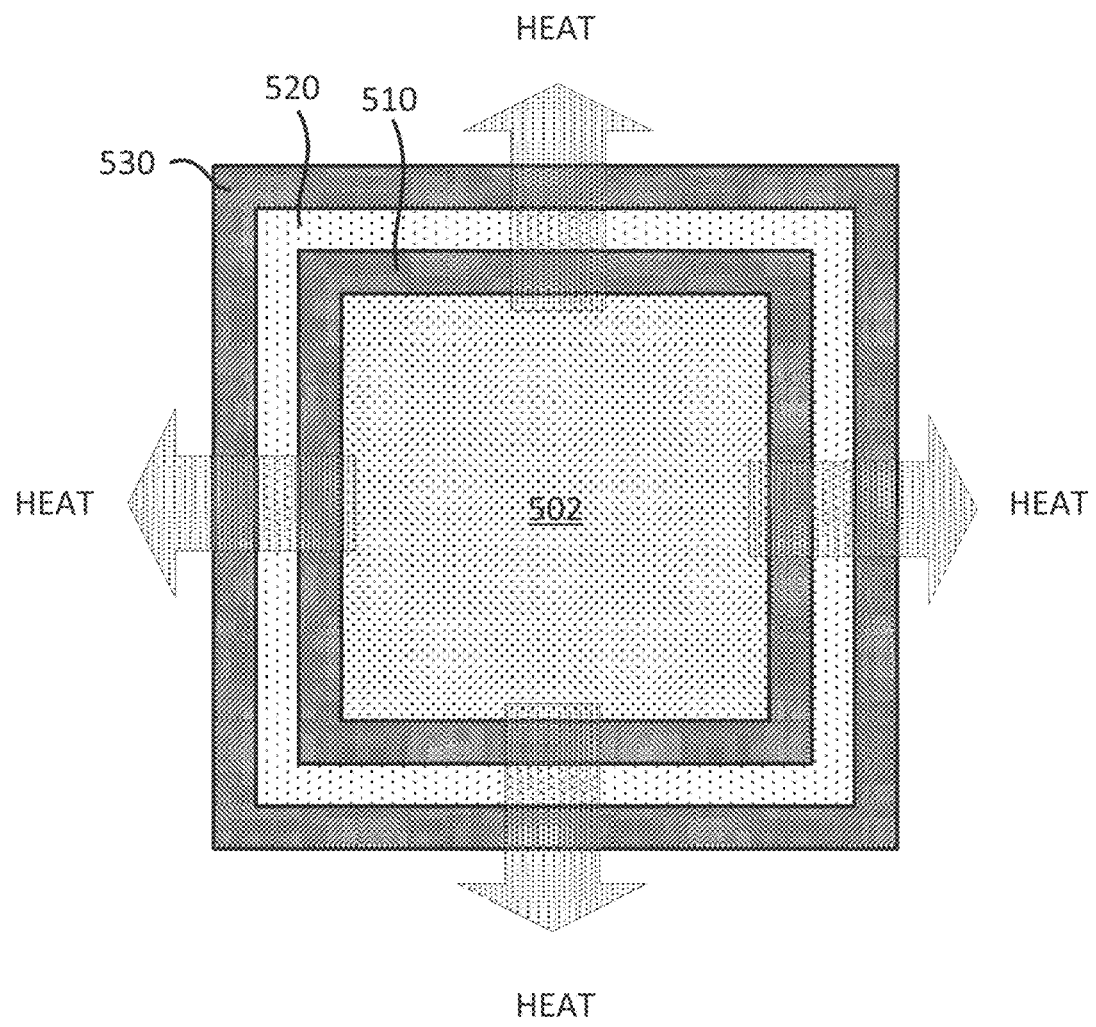
FIG. 8 illustrates a plan view of heat flow for an energy harvesting device.

FIGS. 7 and 8 illustrate exemplary heat flows in an energy harvesting device coupled to a region comprising a heat generating device.

FIG. 7 illustrates a profile view of heat flow for the energy harvesting device 500 coupled to the heat generating device 502. As shown in FIG. 7, the insulation layer 540 of the energy harvesting device 500 helps prevent heat from dissipating vertically (e.g., top portion) and more heat is then forced or directed to dissipate laterally through the first thermal conductive layer 510, the thermoelectric generator (TEG) 520 and/or the second thermal conductive layer 530. As mentioned above, the more heat that is dissipated laterally through the first thermal conductive layer 510, the thermoelectric generator (TEG) 520 and/or the second thermal conductive layer 530, the more energy is harvested by the energy harvesting device 500.

FIG. 8 illustrates a plan view of heat flow for the energy harvesting device 500 coupled to the heat generating device

502. As shown in FIG. 8, heat is dissipated through the lateral sides or lateral surfaces of the energy harvesting device 500.

Exemplary Thermoelectric Generator (TEG)

Figure 9:
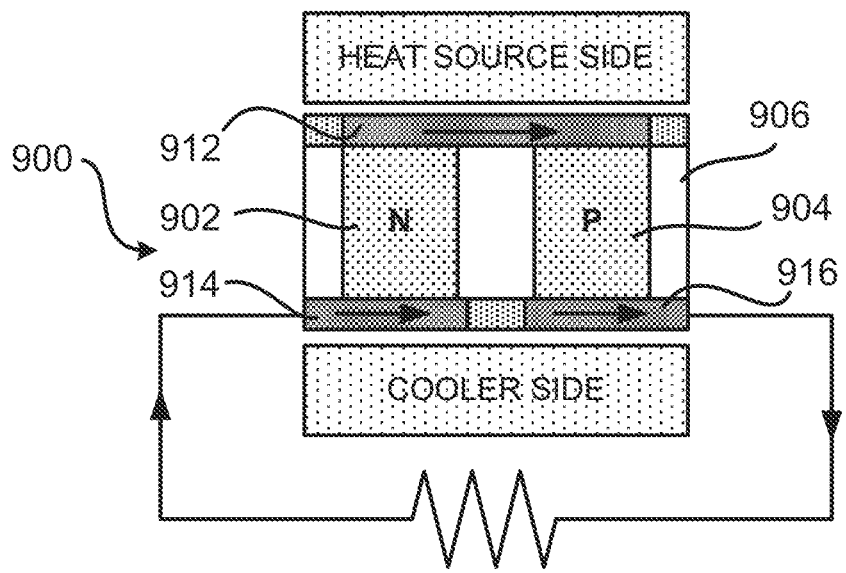
FIG. 9 illustrates an exemplary thermoelectric generator (TEG) of an energy harvesting device.

FIG. 9 illustrates an example of a thermoelectric generator (TEG) 900. The thermoelectric generator (TEG) 900 may be any of the thermoelectric generators (TEGs) (e.g., 520) described in the present disclosure. In some implementations, the thermoelectric generator (TEG) 900 is a solid state device that converts heat or temperature differences into electrical energy through a phenomenon called the Seebeck effect, which is a form of thermoelectric effect.

The thermoelectric generator (TEG) 900 includes an N-doped component 902 (e.g., N-doped semiconductor) and a P-doped component 904 (e.g., P-doped semiconductor), a carrier 906, an interconnect 912, an interconnect 914, and an interconnect 916. The carrier 906 may be optional. The thermoelectric generator (TEG) 900 may include several N-doped components 902 and several P-doped components 904. The thermoelectric generator (TEG) 900 may include several interconnects 912, several interconnects 914 and several interconnects 916. The interconnect 912 is located on a first side (e.g., bottom side) of the thermoelectric generator (TEG) 900. The interconnect 914 and the interconnect 916 are located on a second side (e.g., top side) of the thermoelectric generator (TEG) 900.

The N-doped component 902 is coupled to the P-doped component 904 through an interconnect. For example, the interconnect 914 is coupled to the N-doped component 902, The N-doped component 902 is coupled to the interconnect 912, The interconnect 912 is coupled to the P-doped component 904, The P-doped component 904 is coupled to another interconnect 916.

Different implementations may use different materials form the components 902 and 904. Examples of components 902 and/or 904 include Bismuth Telluride, Lead Telluride, Calcium Manganese Oxide, and/or a combination thereof.

As shown in FIG. 9, the temperature difference between a top portion of the thermoelectric generator (TEG) 900 and a bottom portion of the thermoelectric generator (TEG) 900 causes or induces a current, which is a form of electrical energy. The higher the temperature difference the higher the current, and therefore the higher the electrical energy. This current can be used to power components and/or devices, or it can be stored in an energy storage device (e.g., battery 409) for later use.

The thermoelectric generator (TEG) 900 can be used to harvest energy from heat that is dissipated by a heat generating device (e.g., 502) instead of letting that heat go to waste. In some implementations, several thermoelectric generators (TEGs) 900 may be implemented in an energy harvesting device (e.g., 500).

Figure 10:
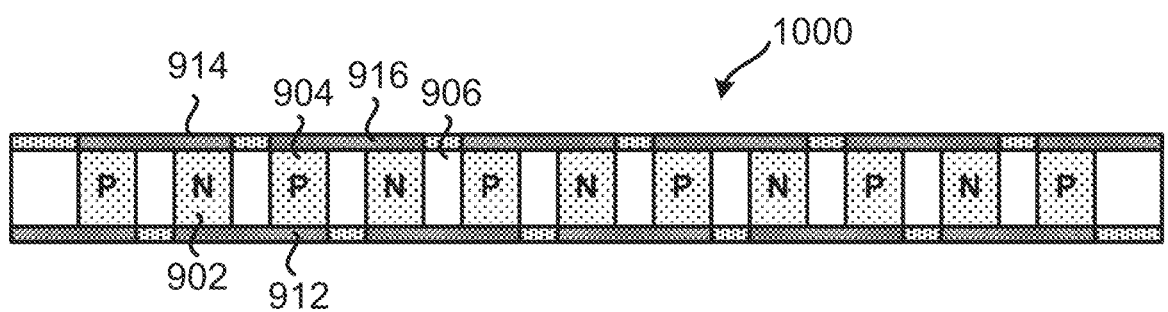
FIG. 10 illustrates another exemplary thermoelectric generator (TEG) of an energy harvesting device.

FIG. 10 illustrates a thermoelectric generator (TEG) 1000 that includes several N-dopes components and several P-doped components. As shown in FIG. 10, the thermoelectric generator (TEG) 1000 includes several thermoelectric generators (TEGs) arranged in an array. In some implementations, the thermoelectric generator (TEG) 1000 may be implemented as the thermoelectric generator (TEG) 520 of the energy harvesting device 500. In some implementations, several thermoelectric generator (TEG) 1000 may be implemented as the thermoelectric generator (TEG) 520 of the energy harvesting device 500. A means for thermal energy harvesting may include the thermoelectric generator (TEG) 900 and/or the thermoelectric generator (TEG) 1000. It is noted that FIGS. 9 and 10 are merely examples of thermoelectric generators (TEGs), Different implementations may use different configurations of thermoelectric generators (TEGs).

Figure 11:
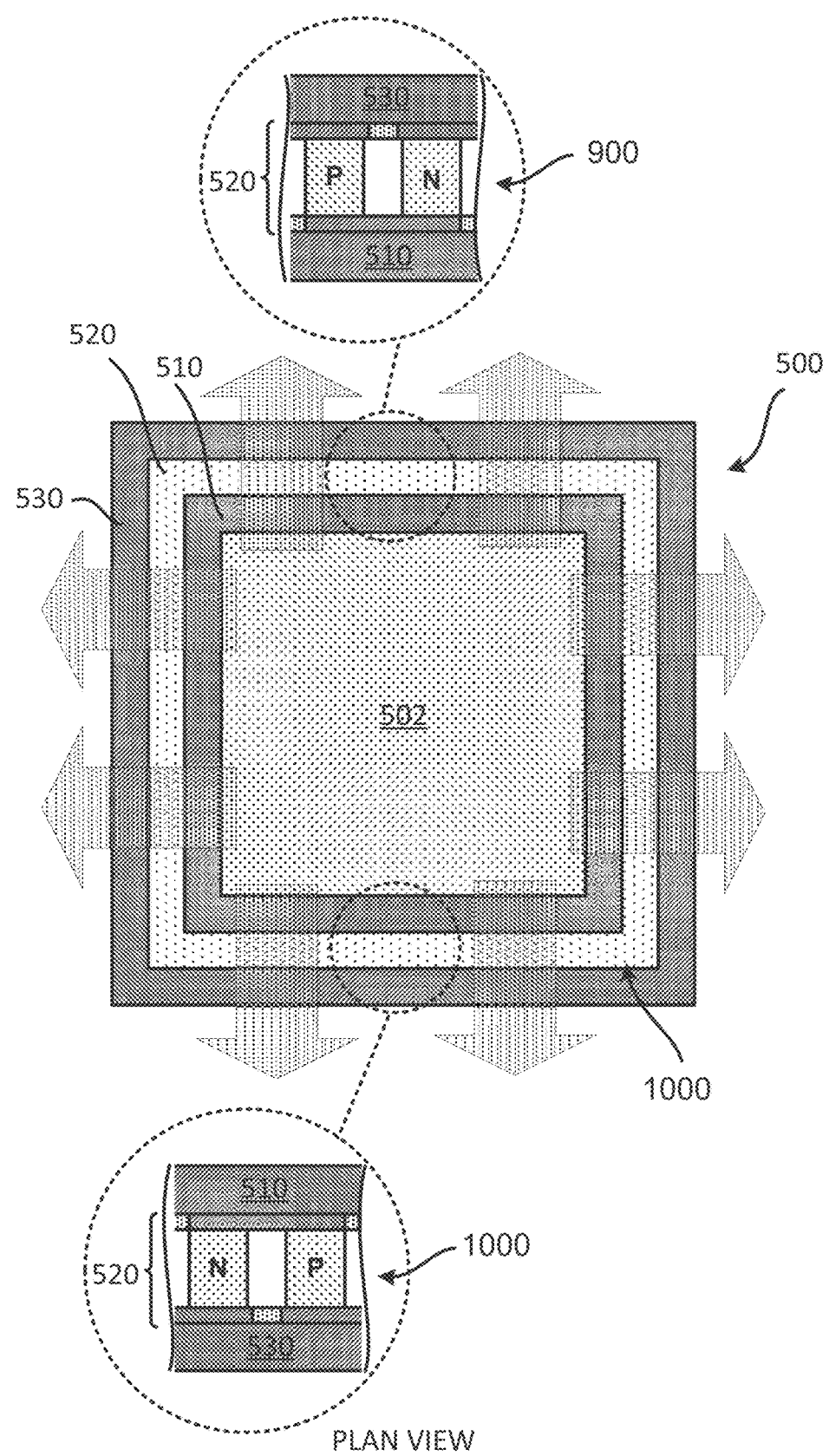
FIG. 11 illustrates a plan view of heat flow for an energy harvesting device.

FIG. 11 illustrates how the thermoelectric generator (TEG) 900 and/or the thermoelectric generator (TEG) 1000 may be implemented in the energy harvesting device 500. In this particular example, the thermoelectric generator (TEG) 520 includes the thermoelectric generator (TEG) 900 and the thermoelectric generator (TEG) 1000. However, different implementations may use different configurations of the thermoelectric generator (TEG) 520. Thus, the energy harvesting device 500 may include one or more thermoelectric generators (TEGs) 900 and/or one or more thermoelectric generators (TEGs) 1000.

As further shown in FIG. 11, heat flows away from the heat generating device 502 and laterally through the first thermal conductive layer 510, the thermoelectric generator (TEG) 900, and/or the second thermal conductive layer 530, which induces in a current in the thermoelectric generator (TEG) 900 that can be used by other components and/or devices, and/or stored. FIG. 11 also shows heat flows away from the heat generating device 502 and laterally through the first thermal conductive layer 510, the thermoelectric generator (TEG) 1000, and/or the second thermal conductive layer 530, which induces in a current in the thermoelectric generator (TEG) 1000 that can be used by other components and/or devices, and/or stored.

Exemplary Method for Fabricating an Energy Harvesting Device

Figure 12:
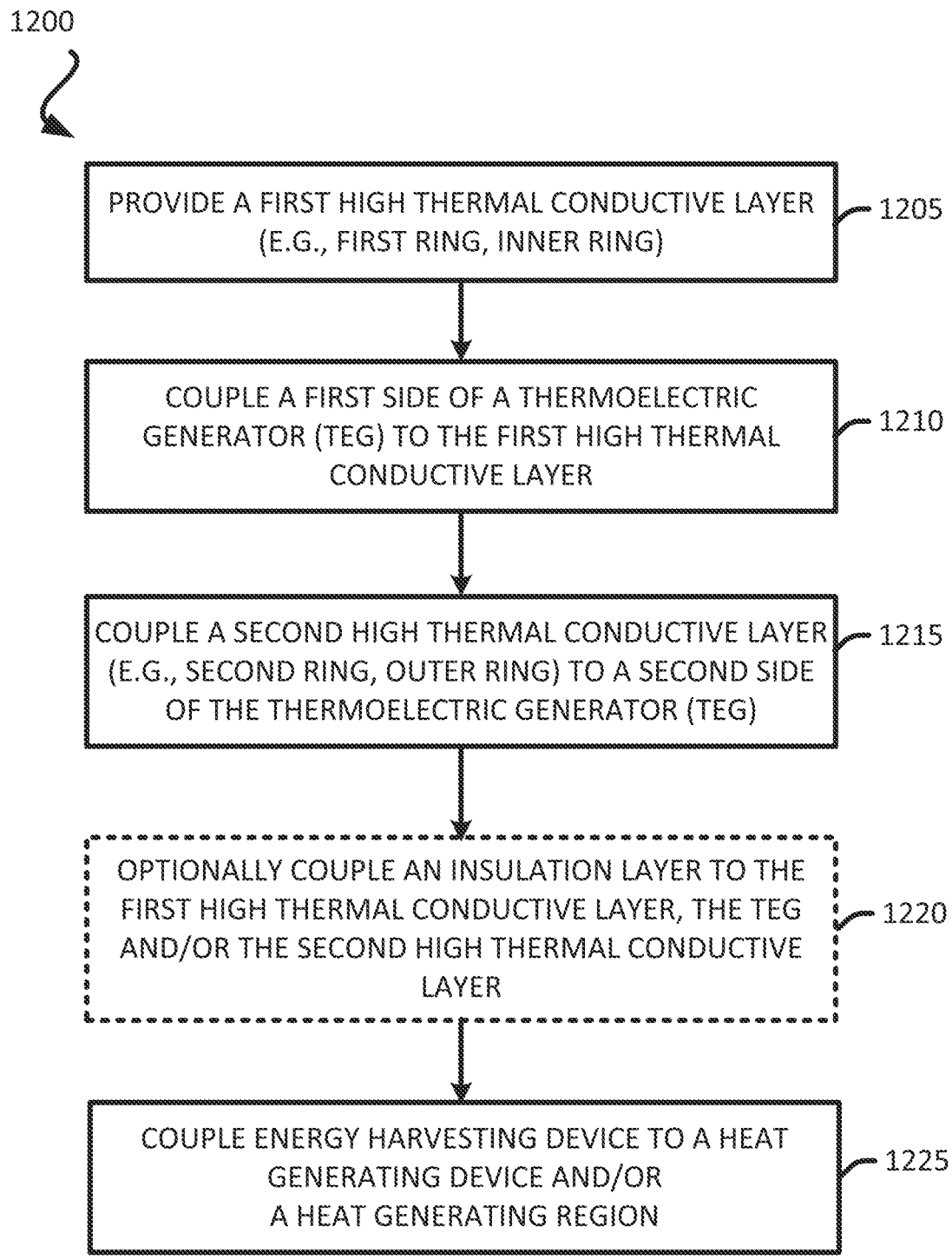
FIG. 12 illustrates an exemplary flow diagram of a method for fabricating a energy harvesting device.

FIG. 12 illustrates a flow chart of an exemplary method 1200 for fabricating a energy harvesting device for a device (e.g., mobile device). The method of FIG. 12 may be used to fabricate any of the energy harvesting devices described in the present disclosure. It is noted the order of the method may be changed and/or modified. In some implementations, some of the processes may be formed concurrently.

The method 1200 for fabricating the energy harvesting device may be performed before, concurrently, or after the device (e.g., mobile) is assembled. For example, the device (e.g., mobile device) may be assembled to include a region, an heat generating device may be provided in the region of the device, and the energy harvesting device may be fabricated and coupled to the region that includes the heat generating device.

As shown in FIG. 12, the method provides (at 1205) a first thermal conductive layer (e.g., 510). The first thermal conductive layer may comprise a high coefficient of thermal conductivity. The first thermal conductive layer may be an inner ring of a energy harvesting device.

The method couples (at 1210) a thermoelectric generator (TEG) to the first thermal conductive layer. An adhesive (e.g., thermal interface material (TIM)) may be used to couple the TEG to the first thermal conductive layer. Different implementations may use different thermoelectric generators (TEGs). Examples of thermoelectric generator (TEG) include the thermoelectric generator (TEG) 520, 900 and/or 1000.

The method couples (at 1215) the second thermal conductive layer (e.g., 530) to the thermoelectric generator (TEG) such that the TEG is between the first thermal conductive layer and the second thermal conductive layer. An adhesive (e.g., thermal interface material (TIM)) may be used to couple the second thermal conductive layer to the TEG.

The method optionally couples (at 1220) an insulation layer (e.g., 540) to the first thermal conductive layer, the TEG and/or the second thermal conductive layer. An adhesive (e.g., thermal interface material (TIM)) may be used to couple the insulation layer to the first thermal conductive layer, the TEG and/or the second thermal conductive layer. In some implementations, the insulation layer (e.g., 540) may be coupled to the first thermal conductive layer and/or the TEG earlier in a process.

The method couples (at 1225) the energy harvesting device (e.g., 500) (which includes the first thermal conductive layer, the TEG, the second thermal conductive layer and/or the insulation layer) to a region of the device that includes a heat generating device. The energy harvesting device may be coupled directly or indirectly to the heat generating device.

Exemplary Method for Energy Harvesting in a Device

Figure 13:
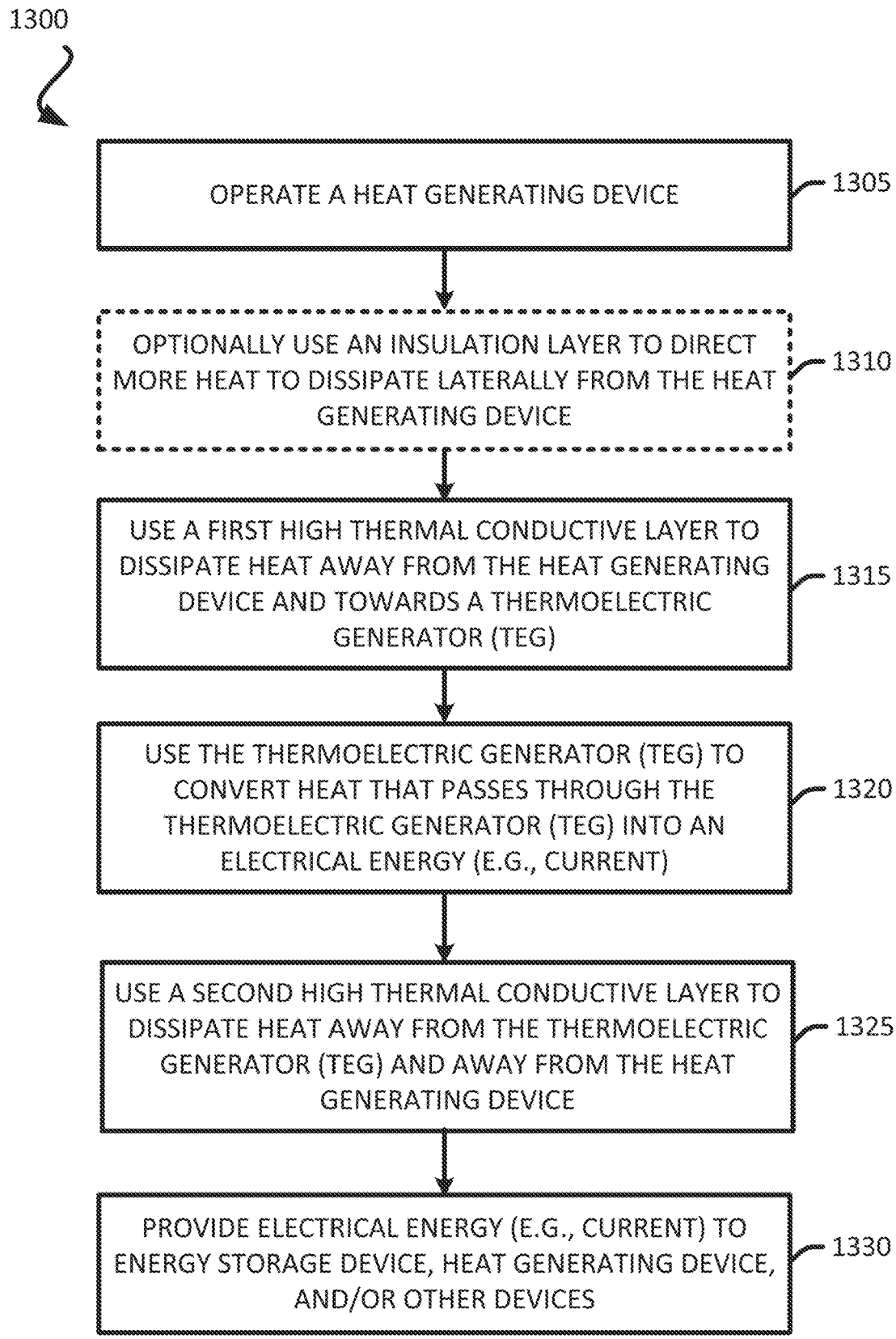
FIG. 13 illustrates an exemplary flow diagram of a method for energy harvesting in a device.

FIG. 13 illustrates a flow chart of an exemplary method 1300 for harvesting energy for a device (e.g., mobile device). The method 1300 of FIG. 13 may be used harvest energy using the any of the energy harvesting devices described in the present disclosure, it is noted the order of the method may be changed and/or modified. In some implementations, some or all of the operations of the method may be performed concurrently. The method 1300 illustrates energy harvesting for one heat generating device. However, in some implementations, the method 1300 may be used to perform energy harvesting for several devices, concurrently or separately. The method 1300 may be performed by one or more integrated devices. For example, in some implementations, one integrated device may perform one or more operations of the method 1300, while another integrated device may perform other operation(s) of the method 1300.

As shown in FIG. 13, the method operates (at 1305) a heat generating device (e.g., 406, 502). In some implementations, operating the heat generating device (e.g., die, integrated device, camera device) includes providing a current that powers the heat generating device. In some implementations, operating the heat generating device causes the heat generating device to generate heat.

The method optionally uses (at 1310) an insulation layer (e.g., 540) to direct more heat to dissipate laterally from the heat generating device. As mentioned above, since the insulation layer has a lower coefficient of thermal conductivity than a first thermal conductive layer (e.g., 510) and heat from the heat generating device will pursue a path of least thermal resistance, a substantial amount of heat will dissipate through the first thermal conductive layer.

The method uses (at 1315) a first thermal conductive layer (e.g., 510) to dissipate heat away from the heat generating device and towards a thermoelectric generator (TEG) (e.g., 520).

The method uses (at 1320) the thermoelectric generator (TEG) to convert heat that passes through the thermoelectric generator (TEG) into an electrical energy (e.g., current). Different implementations may use different thermoelectric generators (TEGs). Examples of thermoelectric generator (TEG) include the thermoelectric generator (TEG) 520, 900 and/or 1000.

The method uses (at 1325) a second thermal conductive layer (e.g., 530) to dissipate heat away from the thermoelectric generator (TEG) and away from the heat generating device.

The method provides (at 1330) the electrical energy (e.g., current) to an energy storage device (e.g., 409), the heat generating device, and/or other devices. The electrical energy that is provided may be the electrical energy that is generated and/or harvested by the thermoelectric generator (TEG).

Exemplary Electronic Devices

Figure 14:
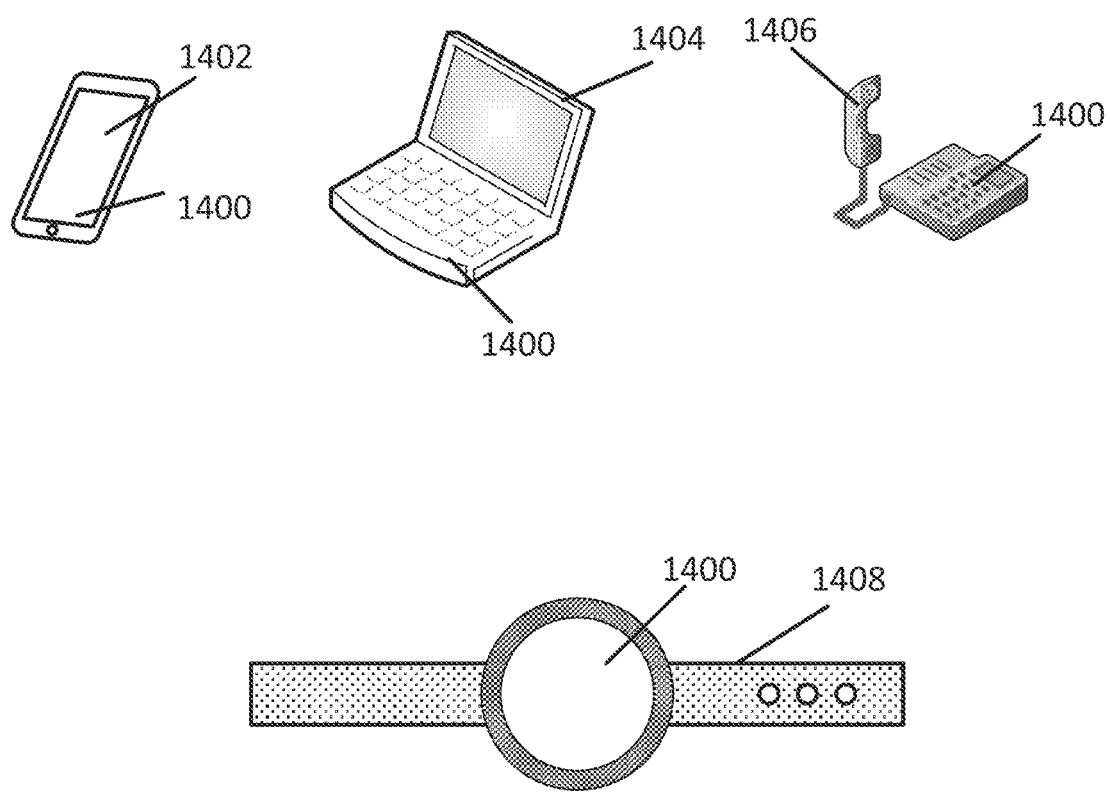
FIG. 14 illustrates various electronic devices that may integrate a semiconductor device, an integrated device, a die, an integrated circuit, a PCB and/or an energy harvesting device described herein.

FIG. 14 illustrates various electronic devices that may be integrated with any of the aforementioned energy harvesting device, integrated device, semiconductor device, integrated circuit, die, interposer, package or package-on-package (PoP). For example, a mobile phone device 1402, a laptop computer device 1404, a fixed location terminal device 1406, a wearable device 1408 may include an integrated device and/or device 1400, as described herein. The device 1400 may be, for example, any of the integrated circuits, dies, integrated devices, integrated device packages, integrated circuit devices, device packages, integrated circuit (IC) packages, package-on-package devices, energy harvesting devices described herein. The devices 1402, 1404, 1406, 1408 illustrated in FIG. 14 are merely exemplary, Other electronic devices may also feature the integrated device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 4-13 and/or 14 may be rearranged and/or combined into a single component, process, feature or function or embodied in several components, processes, or functions. Additional elements, components, processes, and/or functions may also be added without departing from the disclosure. It should also be noted that FIGS. 4-13 and/or 14 and its corresponding description in the present disclosure is not limited to dies and/or ICs. In some implementations, FIGS. 4-13 and/or 14 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
a printed circuit board;
a heat generating device located over a surface of the printed circuit board,
  wherein the heat generating device includes a semiconductor die,
  wherein the heat generating device comprises a backside and a lateral side, and
  wherein the backside of the heat generating device faces away from the printed circuit board;
a thermally conductive adhesive coupled to the heat generating device; and
an energy harvesting device coupled to the heat generating device and laterally surrounding the heat generating device, wherein the energy harvesting device is in contact with the lateral side of the heat generating device through the thermally conductive adhesive, wherein the energy harvesting device comprises:
  a first thermal conductive layer, extending vertically along the lateral side of the heat generating device, and located laterally around the lateral side of the heat generating device;
  a thermoelectric generator (TEG) coupled to the first thermal conductive layer, wherein the TEG is configured to convert heat that passes through the TEG into electrical energy;
  a second thermal conductive layer coupled to the thermoelectric generator (TEG) such that the thermoelectric generator (TEG) is located between the first thermal conductive layer and the second thermal conductive layer; and
  a thermal insulation layer coupled to the energy harvesting device, and located over the backside of the heat generating device, wherein the thermal insulation layer comprises a solid material,
  wherein the thermoelectric generator (TEG) and the second thermal conductive layer laterally surround the lateral side of the heat generating device,
  wherein the second thermal conductive layer is a separate thermal conductive layer from the first thermal conductive layer,
  wherein the second thermal conductive layer is not in direct contact with the first thermal conductive layer,
  wherein the thermoelectric generator (TEG) laterally surrounds the first thermal conductive layer, and
  wherein the second thermal conductive layer laterally surrounds the thermoelectric generator (TEG).

2. The device of claim 1, further comprising an energy storage device configured to store electrical energy from the TEG.

3. The device of claim 1, further comprising an integrated device, wherein the TEG is further configured to provide electrical energy to the integrated device.

4. The device of claim 1, further comprising:
a camera device; and
a second energy harvesting device coupled to the camera device and laterally surrounding the camera device,
wherein the backside and the lateral side of the heat generating device comprises a backside and a lateral side of the semiconductor die.

5. The device of claim 1, wherein the energy harvesting device is configured to harvest about at least 1.5% of the input power of the heat generating device.

6. The device of claim 1, wherein the thermal insulation layer is operable to reduce heat dissipating vertically from the heat generating device.

7. The device of claim 6, wherein the thermal insulation layer is operable to direct heat dissipation laterally through the first thermal conductive layer.

8. The device of claim 6, wherein the thermal insulation layer is operable to direct heat dissipation laterally through the first thermal conductive layer, the TEG, and the second thermal conductive layer.

9. The device of claim 1, wherein the thermal insulation layer is operable to direct heat dissipation laterally through the first thermal conductive layer, the TEG, and the second thermal conductive layer.

* * * * *